US008724397B2

(12) United States Patent
Asaoka et al.

(10) Patent No.: US 8,724,397 B2
(45) Date of Patent: May 13, 2014

(54) NON-VOLATILE SEMICONDUCTOR MEMORY DEVICE AND METHOD OF READING DATA THEREOF

(75) Inventors: Norichika Asaoka, Yokohama (JP); Masanobu Shirakawa, Chigasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 259 days.

(21) Appl. No.: 13/425,859

(22) Filed: Mar. 21, 2012

(65) Prior Publication Data

US 2013/0100754 A1  Apr. 25, 2013

(30) Foreign Application Priority Data

Oct. 19, 2011  (JP) ................. 2011-229376

(51) Int. Cl.
*G11C 16/06* (2006.01)
(52) U.S. Cl.
USPC . 365/185.25; 365/218; 365/222; 365/185.11; 365/185.23; 365/185.24
(58) Field of Classification Search
USPC .......... 365/185.25, 218, 222, 185.11, 185.23, 365/185.24
See application file for complete search history.

(56) References Cited

U.S. PATENT DOCUMENTS

| 2005/0237801 | A1 | 10/2005 | Shih |
| 2007/0252201 | A1 | 11/2007 | Kito et al. |
| 2009/0109761 | A1 | 4/2009 | Jin et al. |
| 2010/0172187 | A1* | 7/2010 | Dunga et al. ............. 365/185.21 |
| 2011/0002172 | A1 | 1/2011 | Kito et al. |
| 2011/0302352 | A1* | 12/2011 | Lee et al. ..................... 711/102 |
| 2012/0206961 | A1* | 8/2012 | Kito ........................... 365/185.2 |

FOREIGN PATENT DOCUMENTS

JP   2007-266143   10/2007

* cited by examiner

*Primary Examiner* — Toan Le
(74) *Attorney, Agent, or Firm* — Oblon, Spivak, McClelland, Maier & Neustadt, L.L.P.

(57) ABSTRACT

A memory string includes a semiconductor layer, a charge accumulation layer, and a conductive layer. The semiconductor layer extends in a direction perpendicular to the semiconductor substrate and functions as a body of a memory cell. The charge accumulation layer may accumulate charges. The conductive layer sandwiches the charge accumulation layer with the semiconductor layer, and functions as a gate of the memory cell. The control circuit performs, before a read operation, a refresh operation of rendering the selected memory cell and a non-selected memory cell conductive to conduct a current from a first end to a second end of the memory string.

17 Claims, 13 Drawing Sheets

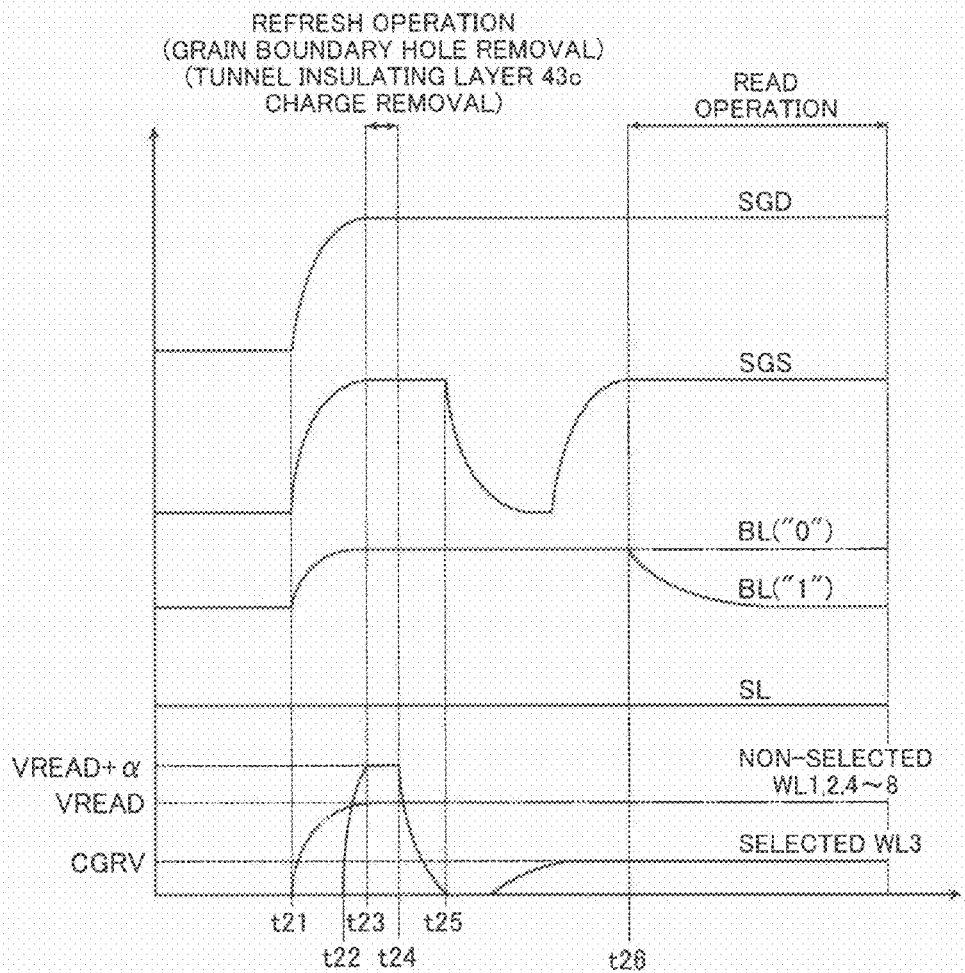

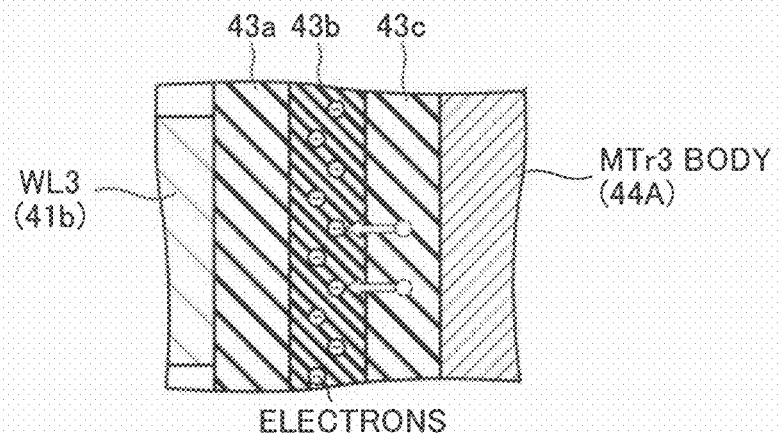
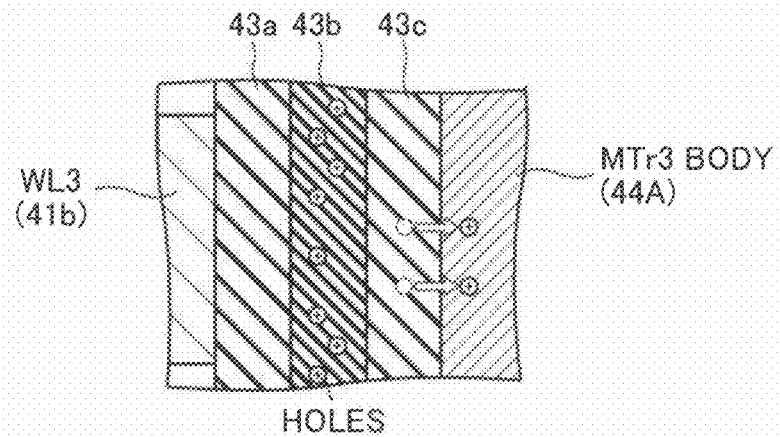

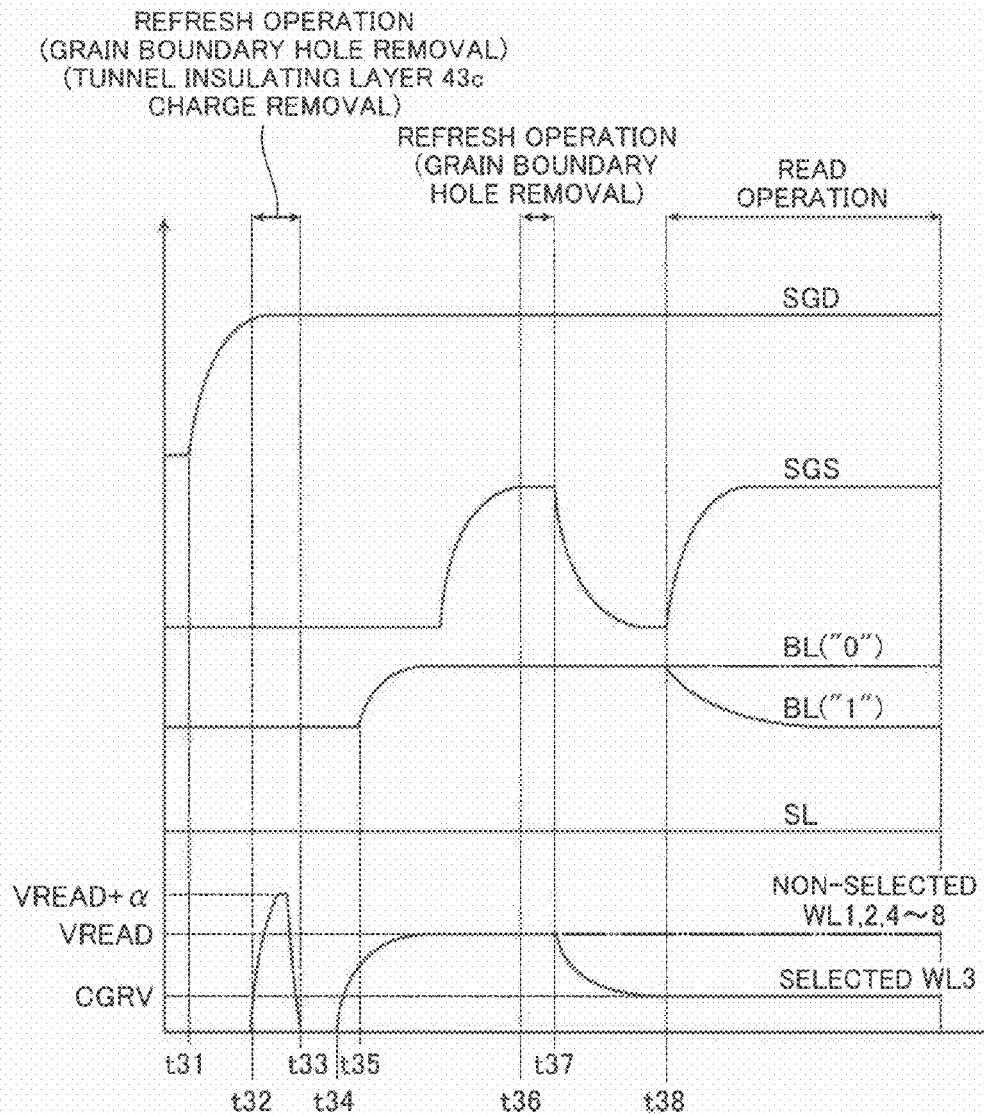

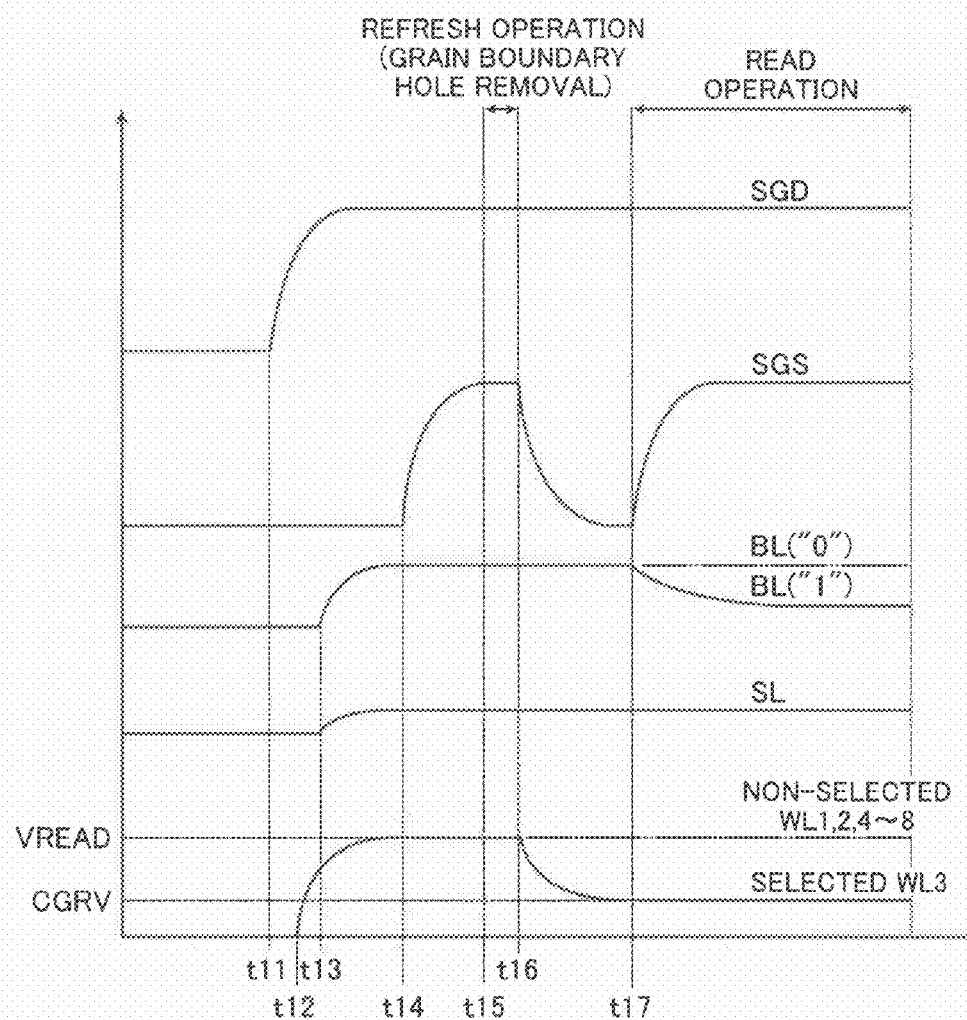

NON-VOLATILE SEMICONDUCTOR MEMORY DEVICE AND METHOD OF READING DATA THEREOF

CROSS-REFERENCE TO RELATED APPLICATIONS

This application is based upon and claims the benefit of priority from the prior Japanese Patent Application No. 2011-229376, filed on Oct. 19, 2011, the entire contents of which are incorporated herein by reference.

FIELD

The embodiments relate to a non-volatile semiconductor memory device capable of electrically rewriting data and a method of reading data thereof.

BACKGROUND

As a method to improve the bit density of a non-volatile semiconductor memory device such as a NAND flash memory, stacked memory cells have recently drawn attention. One proposed technology is a stacked NAND flash memory including a vertical transistor as a memory transistor.

BRIEF DESCRIPTION OF THE DRAWINGS

FIG. 9 is a timing chart of a refresh operation according to a second embodiment.

FIG. 10A illustrates an effect of the refresh operation according to the first embodiment.

FIG. 10B illustrates an effect of the refresh operation according to the first embodiment.

FIG. 11 is a timing chart of a refresh operation according to a third embodiment.

FIG. 16 is a timing chart of a refresh operation according to another embodiment.

DETAILED DESCRIPTION

Figure 1:
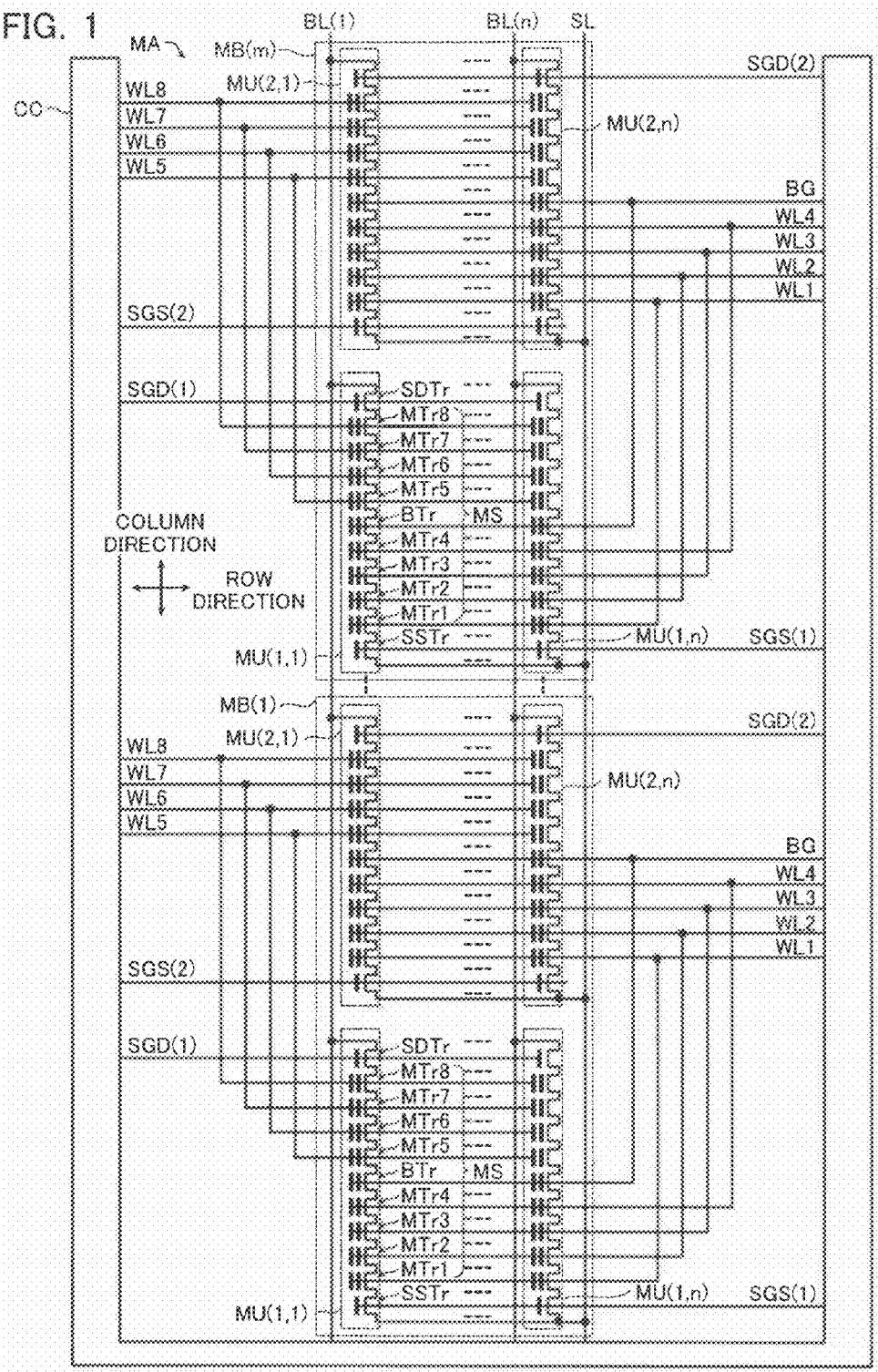
FIG. 1 illustrates a memory cell array MA and a peripheral circuit CC of a non-volatile semiconductor memory device according to a first embodiment.

A non-volatile semiconductor memory device according to an aspect includes a semiconductor substrate, a memory string, and a control circuit. The memory string is provided above the semiconductor substrate. The memory string includes a plurality of memory cells. The control circuit performs a read operation of reading data held in a selected memory cell among the memory cells. The memory string includes a semiconductor layer, a charge accumulation layer, and a conductive layer. The semiconductor layer extends in a direction perpendicular to the semiconductor substrate and functions as a body of a memory cell. The charge accumulation layer is capable of accumulating a charge. The conductive layer sandwiches the charge accumulation layer with the semiconductor layer, and also functions as a gate of the memory cell. The control circuit performs, before the read operation, a refresh operation of rendering the selected memory cell and the non-selected memory cell conductive to conduct a current from a first end to a second end of the memory string.

Referring now to the drawings, non-volatile semiconductor memory devices according to the embodiments will be described.

First Embodiment

[Schematic Configuration]

Referring first to FIG. 1, a schematic configuration of a non-volatile semiconductor memory device according to a first embodiment will be described. With reference to FIG. 1, the non-volatile semiconductor memory device according to the first embodiment includes a memory cell array MA and a peripheral circuit CC. The peripheral circuit CC controls, for example, a voltage applied to a memory transistor included in the memory cell array MA.

With reference to FIG. 1, the memory cell array MA includes m memory blocks MB(1), . . . , MB(m). Note that all memory blocks MB(1), . . . , MB(m) may hereinafter be collectively described as a memory block MB.

Each memory block MB includes memory units MU(1, 1) to MU(2, n) arranged in a matrix of n-rows and 2 columns. The n-rows and 2 columns are merely an example, and the invention is not limited thereto. Each of the memory units MU(1, 1) to MU(2, n) may hereinafter be described merely as a memory unit MU without distinction.

First ends of the memory units MU(1, 1) to MU(2, n) are connected to bit-lines BL(1) to BL(n). Second ends of the memory units MU(1, 1) to MU(2, n) are connected to a source-line SL. The bit-lines BL(1) to BL(n) are arranged in the row direction at a predetermined pitch and extend in the column direction over the memory blocks MB. All bit-lines BL(1), . . . , BL(n) may hereinafter be collectively described as a bit-line BL.

Each memory unit MU includes a memory string MS, a source-side select transistor SSTr, and a drain-side select transistor SDTr.

With reference to FIG. 1, the memory string MS includes memory transistors MTr1 to MTr8 (memory cells) and a back gate transistor BTr, which are connected in series. The memory transistors MTr1 to MTr4 are connected together in series. The memory transistors MTr5 to MTr8 are also connected together in series. The back gate transistor BTr is connected between the memory transistor MTr4 and the memory transistor MTr5. Note that with reference to FIG. 2 described below, the memory transistors MTr1 to MTr8 are three-dimensionally arranged in the row direction, the column direction, and the stacking direction.

The memory transistors MTr1 to MTr8 each include a charge accumulation layer. Each memory transistor holds data by accumulating or discharging a charge from the charge accumulation layer. The back gate transistor BTr is rendered conductive at least when the memory string MS is selected as an operation target.

In each of the memory blocks MB(1) to MB(m), the gates of the memory transistors MTr1 to MTr8 arranged in n-rows and 2 columns are commonly connected to respective word-lines WL1 to WL8. The gates of the back gate transistors BTr arranged in n-rows and 2 columns are commonly connected to a back gate line BG.

The source-side select transistor SSTr has a drain connected to a source of the memory string MS. The source-side select transistor SSTr has a source connected to the source-line SL. In each memory block MB, the gates of the n source-side select transistors SSTr aligned in the row direction are commonly connected to one source-side select gate line SGS(1) or SGS(2). Note that the source-side select gate lines SGS(1) and SGS(2) may hereinafter be collectively referred to as a source-side select gate line SGS without distinction.

The drain-side select transistor SDTr has a source connected to a drain of the memory string MS. The drain-side select transistor SDTr has a drain connected to a bit-line BL. In each memory block MB, the gates of the n drain-side select transistors SDTr aligned in the row direction are commonly connected to one drain-side select gate line SGD(1) or SGD(2). Note that the, drain-side select gate lines SGD(1) and SGD(2) may hereinafter be collectively referred to as a drain-side select gate line SGD without distinction.

[Stacked Structure]

Figure 2:
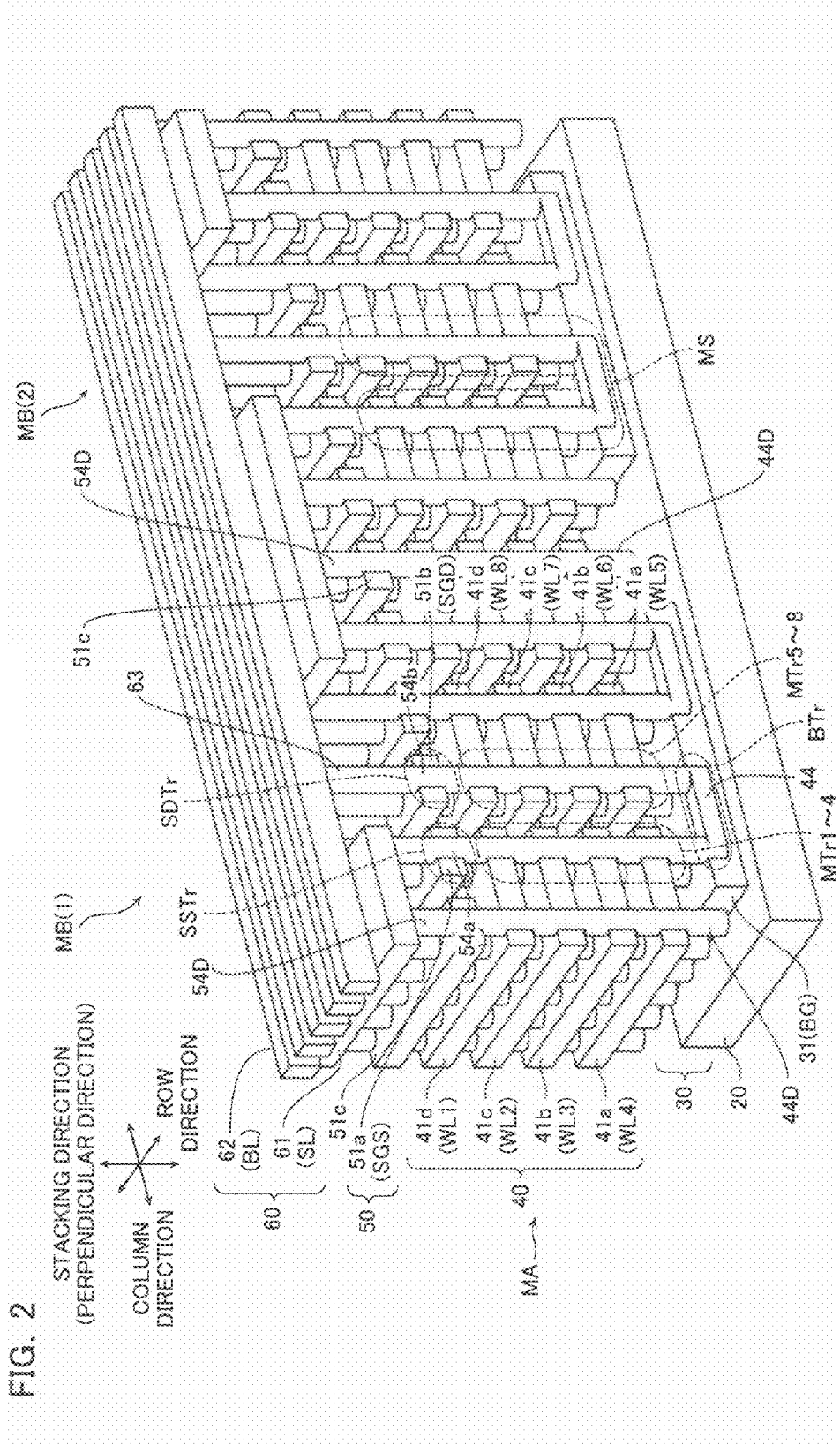
FIG. 2 is a perspective view showing the stacked structure of the memory cell array MA according to the first embodiment.
Figure 3:
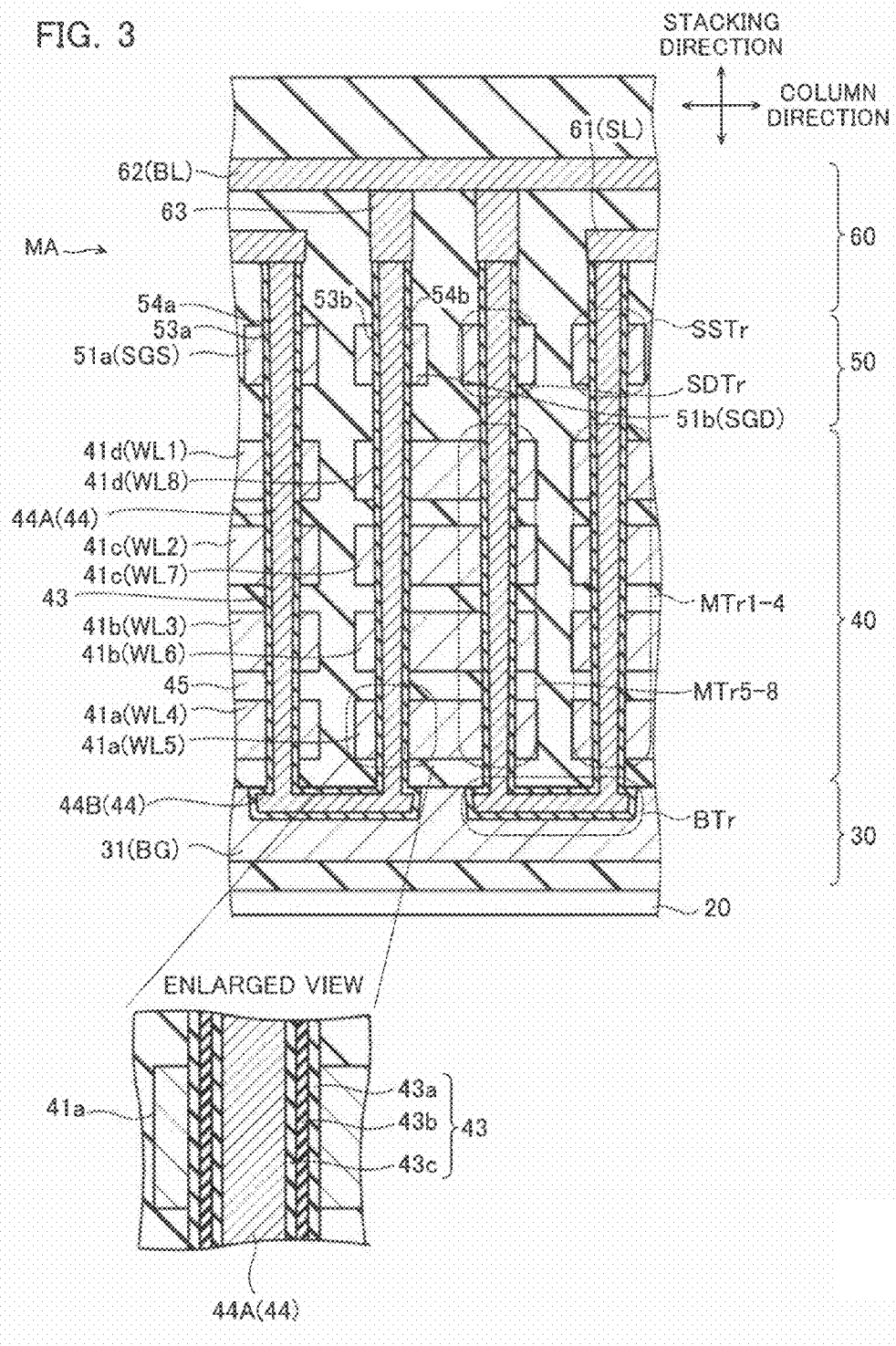
FIG. 3 is a cross-sectional view showing the stacked structure of the memory cell array MA according to the first embodiment.

With reference to FIG. 2 and FIG. 3, one memory block MB includes a back gate layer 30, a memory layer 40, a select transistor layer 50, and a wiring layer 60, which are sequentially stacked on a substrate 20. The back gate layer 30 functions as the back gate transistors BTr. The memory layer 40 functions as the memory transistors MTr1 to MTr8. The select transistor layer 50 functions as the drain-side select transistors SDTr and the source-side select transistors SSTr. The wiring layer 60 functions as the source-line SL and the bit-line BL.

With reference to FIG. 2 and FIG. 3, the back gate layer 30 includes a back gate conductive layer 31. The back gate conductive layer 31 functions as the back gate line BG and as the gates of the back gate transistors BTr. The back gate conductive layer 31 extends two-dimensionally like a plate in the row and column directions parallel to the semiconductor substrate 20. The back gate conductive layer 31 is made of a material such as polysilicon (poly-Si).

With reference to FIG. 3, the back gate layer 30 includes a memory gate insulating layer 43 and a joining semiconductor layer 44B. The memory gate insulating layer 43 is provided between the joining semiconductor layer 44B and the back gate conductive layer 31. The joining semiconductor layer 44B functions as a body (channel) of the back gate transistor BTr. The joining semiconductor layer 44B trims the back gate conductive layer 31. The joining semiconductor layer 44B is formed in a generally rectangular shape having a longitudinal direction in the column direction when viewed in top plan view. A plurality of joining semiconductor layers 44B are formed in a matrix in the row and column directions in one memory block MB. Each joining semiconductor layer 44B is made of a material such as polysilicon (poly-Si).

With reference to FIG. 2 and FIG. 3, the memory layer 40 is formed in a layer above the back gate layer 30. The memory layer 40 includes four word-line conductive layers 41a to 41d. The word-line conductive layer 41a functions as the word-line WL4 and as the gate of the memory transistor MTr4. The word-line conductive layer 41a also functions as the word-line WL5 and as the gate of the memory transistor MTr5. Likewise, the word-line conductive layers 41b to 41d function as the respective word-lines WL1 to WL3 and as the respective gates of the memory transistors MTr1 to MTr3. The word-line conductive layers 41b to 41d also function as the respective word-lines WL6 to WL8 and as the respective gates of the memory transistors MTr6 to MTr8.

The word-line conductive layers 41a to 41d are stacked with an interlayer insulating layer 45 disposed therebetween. The word-line conductive layers 41a to 41d are provided at a certain pitch in the column direction and extend in the row direction (a direction perpendicular to the plane of FIG. 3) as the longitudinal direction. The word-line conductive layers 41a to 41d are made of a material such as polysilicon (poly-Si).

With reference to FIG. 3, the memory layer 40 includes the memory gate insulating layer 43, a columnar semiconductor layer 44A, and a dummy semiconductor layer 44D. The memory gate insulating layer 43 is provided between the columnar semiconductor layer 44A and the word-line conductive layers 41a to 41d. The columnar semiconductor layer 44A functions as the bodies (channels) of the memory transistors MTr1 to MTr8. The dummy semiconductor layer 44D does not function as the bodies of the memory transistors MTr1 to MTr8.

The memory gate insulating layer 43 includes, from a side surface sides of the word-line conductive layers 41a to 41d to a side of the memory columnar semiconductor layer 44A, a block insulating layer 43a, a charge accumulation layer 43b, and a tunnel insulating layer 43c. The charge accumulation layer 43b has a function of accumulating a charge.

The block insulating layer 43a is formed on side walls of the word-line conductive layers 41a to 41d with a predetermined thickness. The charge accumulation layer 43b is formed on a side wall of the block insulating layer 43a with a predetermined thickness. The tunnel insulating layer 43c is formed on a side wall of the charge accumulation layer 43b with a predetermined thickness. The block insulating layer 43a and the tunnel insulating layer 43c are made of a material such as silicon dioxide ($SiO_2$). The charge accumulation layer 43b is made of a material such as silicon nitride (SiN). In the memory transistor MTr, a floating gate is used as the charge accumulation layer and a FG (Floating gate) structure using a method of causing the floating gate to trap electrons may be adopted. In that case, a first floating gate of a first memory transistor MTr is separated from a second floating gate of a second memory transistor MTr.

The columnar semiconductor layer 44A passes through the word-line conductive layers 41a to 41d and the interlayer insulating layer 45. The columnar semiconductor layer 44A extends in a direction perpendicular to the semiconductor substrate 20. A pair of columnar semiconductor layers 44A are aligned with the respective end portion vicinities in the column direction of the joining semiconductor layer 44B. The columnar semiconductor layer 44A is made of a material such as polysilicon (poly-Si). Note that the dummy semiconductor layer 44D passes through the word-line conductive layers 41a to 41d and the interlayer insulating layer 45. Under the dummy semiconductor layer 44D, the back gate conductive layer 31 is not provided.

In the above back gate layer 30 and the memory layer 40, the pair of columnar semiconductor layers 44A and the joining semiconductor layer 44B joining the lower ends thereof form a memory semiconductor layer 44 functioning as the body (channel) of the memory string MS. The memory semiconductor layer 44 is formed in a U shape when viewed in the row direction.

The above back gate layer 30 has, in other words, a configuration in which the back gate conductive layer 31 surrounds a side surface and a bottom surface of the joining semiconductor layer 44B via the memory gate insulating layer 43. The back gate conductive layer 31 and the joining semiconductor layer 44B sandwich the memory gate insulating layer 43. Further, the above memory layer 40 has, in other words, a configuration in which the word-line conductive layers 41a to 41d surround the side surface of the columnar semiconductor layer 44A via the memory gate insulating layer 43. The word-line conductive layers 41a to 41d and the columnar semiconductor layer 44A sandwich the memory gate insulating layer 43.

With reference to FIG. 2 and FIG. 3, the select transistor layer 50 includes a source-side conductive layer 51a, a drain-side conductive layer 51b, and a dummy conductive layer 51c. The source-side conductive layer 51a functions as the source-side select gate line SGS and as the gate of the source-side select transistor SSTr. The drain-side conductive layer 51b functions as the drain-side select gate line SGD and as the gate of the drain-side select transistor SDTr. The dummy conductive layer 51c does not function as the source-side select gate line SGS or the drain-side select gate line SGD.

The source-side conductive layer 51a is formed in a layer above one of the columnar semiconductor layers 44A included in the memory semiconductor layer 44. The drain-side conductive layer 51b is formed in the same layer as the source-side conductive layer 51a. The layer 51b is also formed in a layer above the other of the columnar semiconductor layers 44A included in the memory semiconductor layer 44. The dummy conductive layer 51c is formed in the same layer as the source-side conductive layer 51a and is formed in a portion other than the portion above the columnar semiconductor layer 44A. The source-side conductive layers 51a, the drain-side conductive layers 51b, and the dummy conductive layers 51c are provided at a predetermined pitch in the column direction and extend in the row direction. The source-side conductive layer 51a and the drain-side conductive layer 51b are made of a material such as polysilicon (poly-Si).

With reference to FIG. 3, the select transistor layer includes a source-side gate insulating layer 53a, a source-side columnar semiconductor layer 54a, a drain-side gate insulating layer 53b, a drain-side columnar semiconductor layer 54b, and a dummy semiconductor layer 54D. The source-side columnar semiconductor layer 54a functions as a body (channel) of the source-side select transistor SSTr. The drain-side columnar semiconductor layer 54b functions as a body (channel) of the drain-side select transistor SDTr.

The source-side gate insulating layer 53a is provided between the source-side conductive layer 51a and the source-side columnar semiconductor layer 54a. The source-side columnar semiconductor layer 54a passes through the source-side conductive layer 51a. The source-side columnar semiconductor layer 54a is connected to a side surface of the source-side gate insulating layer 53a and a top surface of one of the pair of columnar semiconductor layers 44A. The layer 54a extends in a direction perpendicular to the semiconductor substrate 20. The source-side columnar semiconductor layer 54a is made of a material such as polysilicon (poly-Si).

The drain-side gate insulating layer 53b is provided between the drain-side conductive layer 51b and the drain-side columnar semiconductor layer 54b. The drain-side columnar semiconductor layer 54b passes through the drain-side conductive layer 51b. The drain-side columnar semiconductor layer 54b is connected to aside surface of the drain-side gate insulating layer 53b and a top surface of the other of the pair of columnar semiconductor layers 44A. The layer 54b extends in a direction perpendicular to the semiconductor substrate 20. The drain-side columnar semiconductor layer 54b is made of a material such as polysilicon (poly-Si).

The dummy semiconductor layer 54D passes through the dummy conductive layer 51c. The dummy semiconductor layer 54D is formed in an I shape. A bottom surface of the dummy semiconductor layer 54D is in contact with a top surface of the dummy semiconductor layer 44D.

The wiring layer 60 includes a source-line layer 61, a bit-line layer 62, and a plug layer 63. The source-line layer 61 functions as the source-line SL. The bit-line layer 62 functions as the bit-line BL.

The source-line layer 61 is in contact with a top surface of the source-side columnar semiconductor layer 54a and extends in the row direction. The bit-line layer 62 is in contact with a top surface of the drain-side columnar semiconductor layer 54b via the plug layer 63 and extends in the column direction. The source-line layer 61, the bit-line layer 62, and the plug layer 63 are made of metal material such as tungsten.

[Effects of Grain Boundaries in Silicon Crystal]

Figure 4:
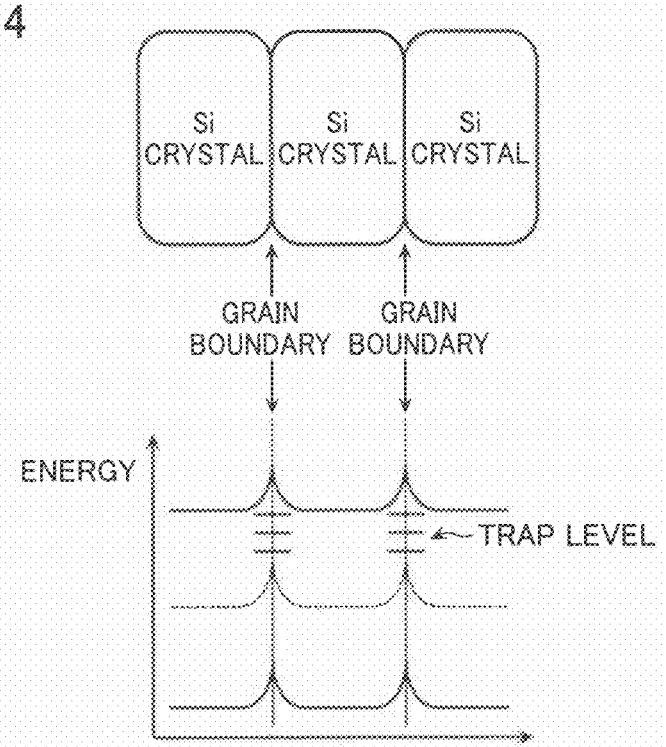
FIG. 4 illustrates the trap levels at the grain boundaries in a silicon crystal.
Figure 5:
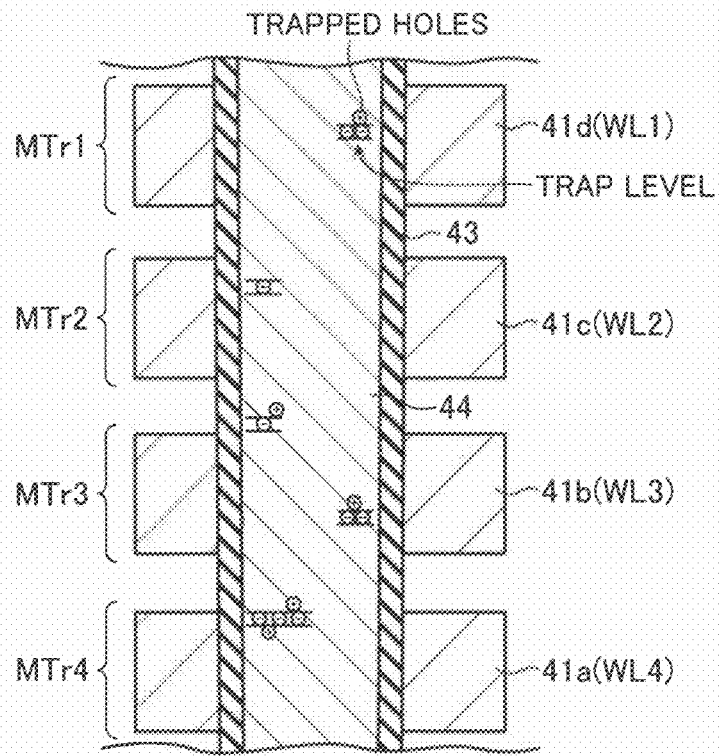
FIG. 5 illustrates holes trapped in the trap levels of a memory semiconductor layer 44 (polysilicon).

Effects of grain boundaries in a silicon crystal will now be described. With reference to FIG. 4, trap levels are formed at grain boundaries in a silicon crystal. If, therefore, the memory semiconductor layer 44 (polysilicon) has grain boundaries as shown in FIG. 5, holes are trapped in the trap levels at the grain boundaries. The holes trapped increase the potential of the bodies of the memory transistors MTr1 to MTr8. As a result, accurate read operation may not be performed.

To solve the above problem, this embodiment performs a refresh operation before the read operation to remove the holes trapped in the trap levels at the grain boundaries in the memory semiconductor layer 44.

[Refresh Operation]

Figure 6:
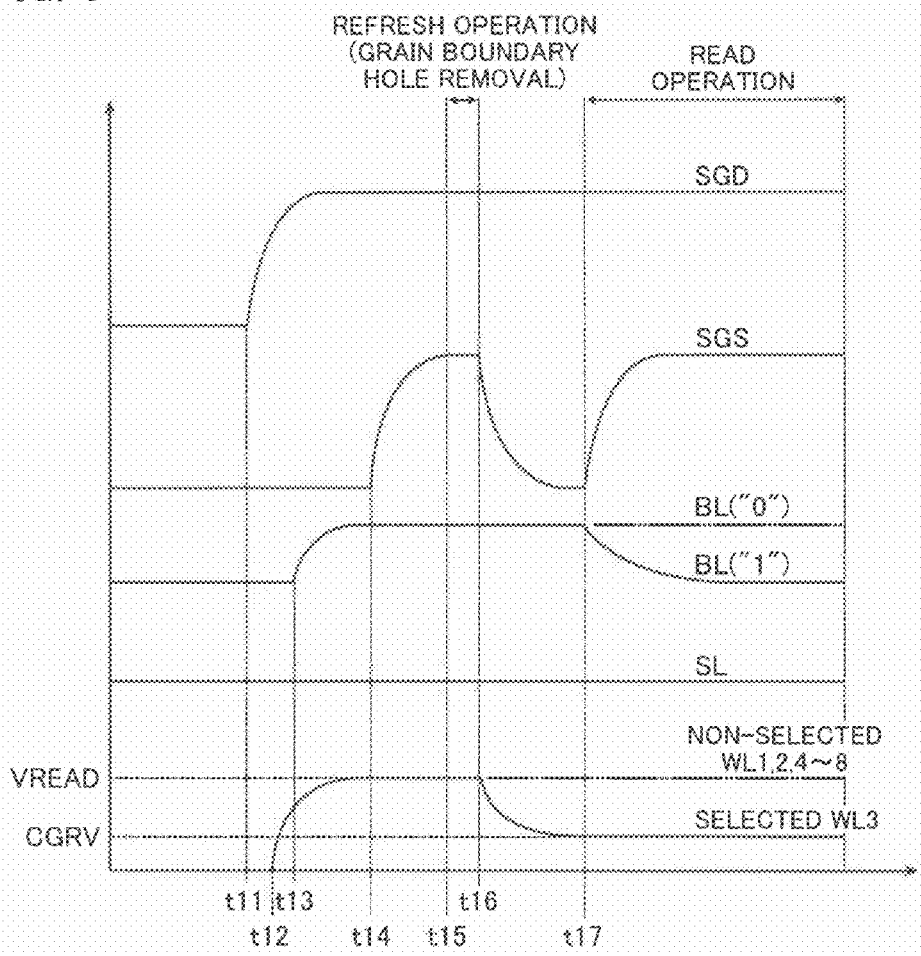
FIG. 6 is a timing chart of a refresh operation according to the first embodiment.

With reference to FIG. 6, the refresh operation will be described. FIG. 6 shows, by way of example, the refresh operation performed before reading data of the selected memory transistor MTr3. With reference to FIG. 6, first at time t11, the control circuit CC increases the voltage of the drain-side select gate line SGD (e.g., from 0 V to 1.5 V). Then at time t12, the control circuit CC increases the voltages of the selected word-line WL3 and the non-selected word-lines WL1, WL2, and WL4 to WL8 to a read voltage VREAD. Then at time t13, the control circuit CC increases the voltage of the bit-line BL (e.g., from 0 V to 1 V). This operation provides the channels of the drain-side select transistor SDTr, the selected memory transistor MTr3, and the non-selected memory transistors MTr1, MTr2, and MTr4 to MTr8, thereby rendering those transistors conductive.

Figure 7:
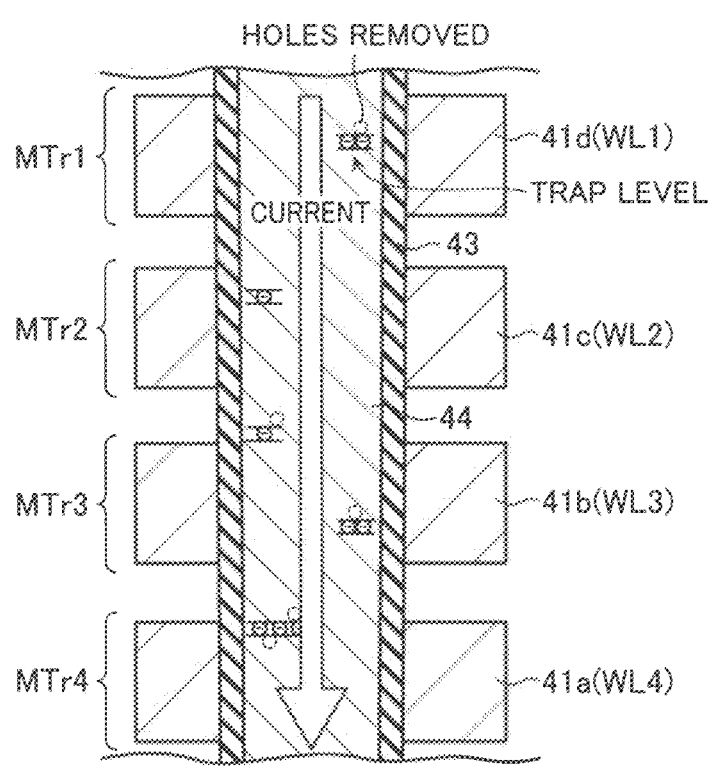
FIG. 7 illustrates an effect of the refresh operation according to the first embodiment.

Then at time t14, the control circuit CC increases the voltage of the source-side select gate line SGS (e.g., from 0 V to 1.5 V), thereby rendering the source-side select transistor SSTr conductive. The refresh operation is thus performed by which a current (a refresh current) flows from a first end to a second end of the memory string MS, thereby removing the holes trapped in the trap levels at the grain boundaries in the memory semiconductor layer 44, as shown in FIG. 7. The refresh operation is performed between time t15 and t16 shown in FIG. 6.

Then at time t16, the control circuit CC decreases the voltage of the source-side select gate line SGS from 1.5 V to 0 V, thereby rendering the source-side select transistor SSTr non-conductive. At time t16, the control circuit CC also decreases the voltage of the selected word-line WL3 to a general middle voltage CGRV between the upper limit and the lower limit of the threshold voltage distribution.

Then at time t17, the control circuit CC increases the voltage of the source-side select gate line SGS (e.g., from 0 V to 1.5 V), thereby rendering the source-side select transistor SSTr conductive. Thus, the read operation to the selected memory transistor MTr3 starts. Therefore, in response to the conductive state/non-conductive state according to data held in the selected memory transistor MTr3, a current flows from the bit-line BL to the source-line SL, thereby changing the bit-line BL voltage. The bit-line BL voltage is sensed and amplified to read data of the selected memory transistor MTr3.

Thus, with reference to FIG. 6, the control circuit CC performs the refresh operation (between time t15 and t16) before the read operation (at time t17 or later). Thus, with reference to FIG. 7, the control circuit CC conducts a current from a first end to a second end of the memory string MS, thereby removing the holes trapped in the trap levels at the grain boundaries in the memory semiconductor layer 44. Therefore, the read operation is performed with a limited number of holes trapped in the trap levels, thereby allowing for the accurate read operation.

Further, in the above refresh operation, the channels are formed in the memory transistors MTr1 to MTr8 (at time t12 in FIG. 6), and then the source-side select transistor SSTr is rendered conductive (at time t14 in FIG. 6), thereby conducting a current through the memory string MS. Thus, compared to a process in which the channels are formed in the memory transistors MTr1 to MTr8 while the source-side select transistor SSTr is rendered conductive, this embodiment sufficiently charges the channels, thereby making it possible to quickly perform the refresh operation.

Second Embodiment

A non-volatile semiconductor memory device according to a second embodiment will now be described. The non-volatile semiconductor memory device in the second embodiment has a similar configuration to that in the first embodiment. The second embodiment solves the problem caused by charges (electrons, holes) trapped in the tunnel insulating layer 43c by performing a refresh operation different from that in the first embodiment. Before describing the refresh operation, effects of charges trapped in the tunnel insulating layer 43c will be described referring to FIG. 8.

[Effects of Charges Trapped in Tunnel Insulating Layer 43c]

Figure 8A:
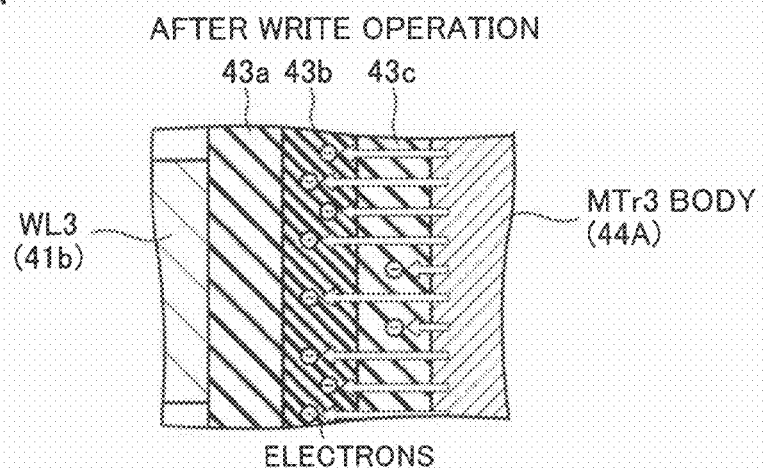
FIG. 8A illustrates charges trapped in a tunnel insulating layer 43c.
Figure 8B:
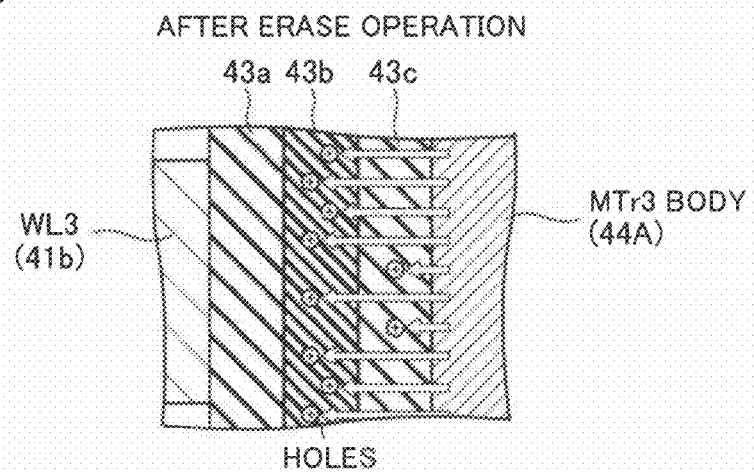
FIG. 8B illustrates charges trapped in the tunnel insulating layer 43c.

In the example shown in FIG. 8A, the write operation causes electrons to be trapped in the charge accumulation layer 43b of the selected memory transistor MTr3 to move the threshold voltage distribution of the selected memory transistor MTr3 in the positive direction. Thus, the selected memory transistor MTr3 starts to be written with data. Unfortunately, during the write operation, electrons are also trapped in the tunnel insulating layer 43c. Further, with reference to FIG. 8B, the erase operation causes holes to be trapped in the charge accumulation layer 43b of the memory transistor MTr3 to move the threshold voltage distribution of the memory transistor MTr3 in the negative direction. Thus, data of the memory transistor MTr3 is erased. Unfortunately, during the erase operation, holes are also trapped in the tunnel insulating layer 43c. The electrons or holes trapped in the tunnel insulating layer 43c as described above are easily detrapped from the tunnel insulating layer 43c as time elapses, thereby varying the threshold voltage of the memory transistor MTr3 as time elapses. Such a variation of the threshold voltage of the memory transistor MTr3 results in reduction of the accuracy of the read operation.

To solve the above problem, this embodiment performs the refresh operation before the read operation to remove the charges (holes, electrons) trapped in the tunnel insulating layer 43c. This embodiment also performs the refresh operation to remove the holes trapped in the trap levels at the grain boundaries in the memory semiconductor layer 44 like the first embodiment.

[Refresh Operation]

With reference to FIG. 9, the refresh operation according to the second embodiment will be described. With reference to FIG. 9, first at time t21, the control circuit CC increases the voltages of the drain-side select gate line SGD and the source-side select gate line SGS (e.g., from 0 V to 1.5 V). At time t21, the control circuit CC also increases the voltage of the bit-line BL (e.g., from 0 V to 1 V). At time t21, the control circuit CC also increases the voltages of the non-selected word-lines WL1, WL2, and WL4 to WL8 to the read voltage VREAD. Thus, the drain-side select transistor SDTr, the source-side select transistor SSTr, and the non-selected memory transistors MTr1, MTr2, and MTr4 to MTr8 are rendered conductive.

Then at time t22, the control circuit CC increases the voltage of the selected word-line WL3 to a voltage VREAD+α, thereby rendering the selected memory transistor MTr3 conductive. Thus, a current flows from a first end to a second end of the memory string MS. Specifically, the refresh operation is started, thereby removing the holes trapped in the trap levels at the grain boundaries in the memory semiconductor layer 44. Additionally, with reference to FIG. 10A, the potential difference between the gate voltage (VREAD+α) of the selected memory transistor MTr3 and the body voltage of the selected memory transistor MTr3 moves the electrons trapped in the tunnel insulating layer 43c to the charge accumulation layer 43b. Further, with reference to FIG. 10B, the holes trapped in the tunnel insulating layer 43c move to the memory semiconductor layer 44. In other words, the charges (electrons, or holes) trapped in the tunnel insulating layer 43c are removed. Note that the voltage VREAD+α is a voltage to allow the above gate-to-body potential difference to remove the charges trapped in the tunnel insulating layer 43c. The voltage VREAD+α is also a voltage not enough to cause miswriting to the memory transistor MTr3. The refresh operation is performed between time t23 and t24 as shown in FIG. 9.

Then at time t24, the control circuit CC decreases the voltage of the selected word-line WL3 to 0 V, thereby rendering the selected memory transistor MTr3 non-conductive. Then at time t25, the control circuit CC decreases the voltage of the source-side select gate line SGS to 0 V, thereby rendering the source-side select transistor SSTr non-conductive.

Then, the control circuit CC decreases the voltage of the selected word-line WL3 to the voltage CGRV, and then increases the voltage of the source-side select gate line SGS (e.g., from 0 V to 1.5 V), thereby rendering the source-side select transistor SSTr conductive. Thus, the control circuit CC starts the read operation at time t26.

Thus, with reference to FIG. 9, the control circuit CC performs the refresh operation (between time t23 and t24) before the read operation (at time t26 or later). Thus, the control circuit CC removes the charges trapped in the tunnel insulating layer 43c and the holes trapped in the trap levels at the grain boundaries in the memory semiconductor layer 44. Therefore, the read operation is performed with a limited number of charges trapped in the tunnel insulating layer 43c and a limited number of holes trapped in the trap levels at the grain boundaries in the memory semiconductor layer 44 number, thereby allowing for the accurate read operation.

Third Embodiment

A non-volatile semiconductor memory device according to a third embodiment will now be described. The non-volatile semiconductor memory device in the third embodiment has a similar configuration to that in the first embodiment. To solve a similar problem to that in the second embodiment, the third embodiment performs a refresh operation. With reference to FIG. 11, the third embodiment performs the refresh operation at a timing of time t32 to t33 to remove the charges trapped in the tunnel insulating layer 43c and the holes trapped in the trap levels at the grain boundaries in the memory semiconductor layer 44. Further, the third embodiment performs the refresh operation between time t36 and t37 to remove the charges trapped in the trap levels at the grain boundaries in the memory semiconductor layer 44. In this regard, the third embodiment is different from the second embodiment.

With reference to FIG. 11, the refresh operation according to the third embodiment will be described in more detail. With reference to FIG. 11, first at time t31, the control circuit CC increases the voltage of the drain-side select gate line SGD (e.g., from 0 V to 1.5 V), thereby rendering the drain-side select transistor SDTr conductive. Then, between time t32 and t33, the control circuit CC increases the voltages of the selected word-line WL3 and the non-selected word-lines WL1, WL2, and WL4 to WL8 to a voltage of VREAD+α' in a pulsed manner, thereby rendering conductive the selected memory transistor MTr3 and the non-selected memory transistors MTr1, MTr2, and MTr4 to MTr8. Thus, the potential difference between the gate voltage (VREAD+α') of the selected memory transistor MTr3 and the body voltage of the selected memory transistor MTr3 removes the charges trapped in the tunnel insulating layer 43c. Further, a current flows from a first end to a second end of the memory string MS, thereby removing the holes trapped in the trap levels at the grain boundaries in the memory semiconductor layer 44. Note that the voltage VREAD+α' is a voltage to allow the above gate-to-body potential difference to remove the charges trapped in the tunnel insulating layer 43c. The voltage VREAD+α' is also a voltage not enough to cause miswriting to the memory transistor MTr3.

Then, at time t34, the control circuit CC increases the voltages of the selected word-line WL3 and the non-selected word-lines WL1, WL2, and WL4 to WL8 to the read voltage VREAD, thereby rendering conductive the selected memory transistor MTr3 and the non-selected memory transistors MTr1, MTr2, and MTr4 to MTr8. Then at time t35, the control circuit CC increases the voltage of the bit-line BL (e.g., from 0 V to 1 V). Then, the control circuit CC increases the voltage of the source-side select gate line SGS (e.g., from 0 V to 1.5 V), thereby rendering the source-side select transistor SSTr conductive. Thus, between time t36 and t37, a current flows from a first end to a second end of the memory string MS, thereby removing the holes trapped in the trap levels at the grain boundaries in the memory semiconductor layer 44.

Then at time t37, the control circuit CC decreases the voltage of the source-side select gate line SGS to 0 V, thereby rendering the source-side select transistor SSTr non-conductive. At time t37, the control circuit CC also decreases the voltage of the selected word-line WL3 to the voltage CGRV. Then at time t38, the control circuit CC increases the voltage of the source-side select gate line SGS (e.g., from 0 V to 1.5 V), thereby rendering the source-side select transistor SSTr conductive. Thus, the control circuit CC starts the read operation at time t38.

Fourth Embodiment

[Configuration]

Figure 12:
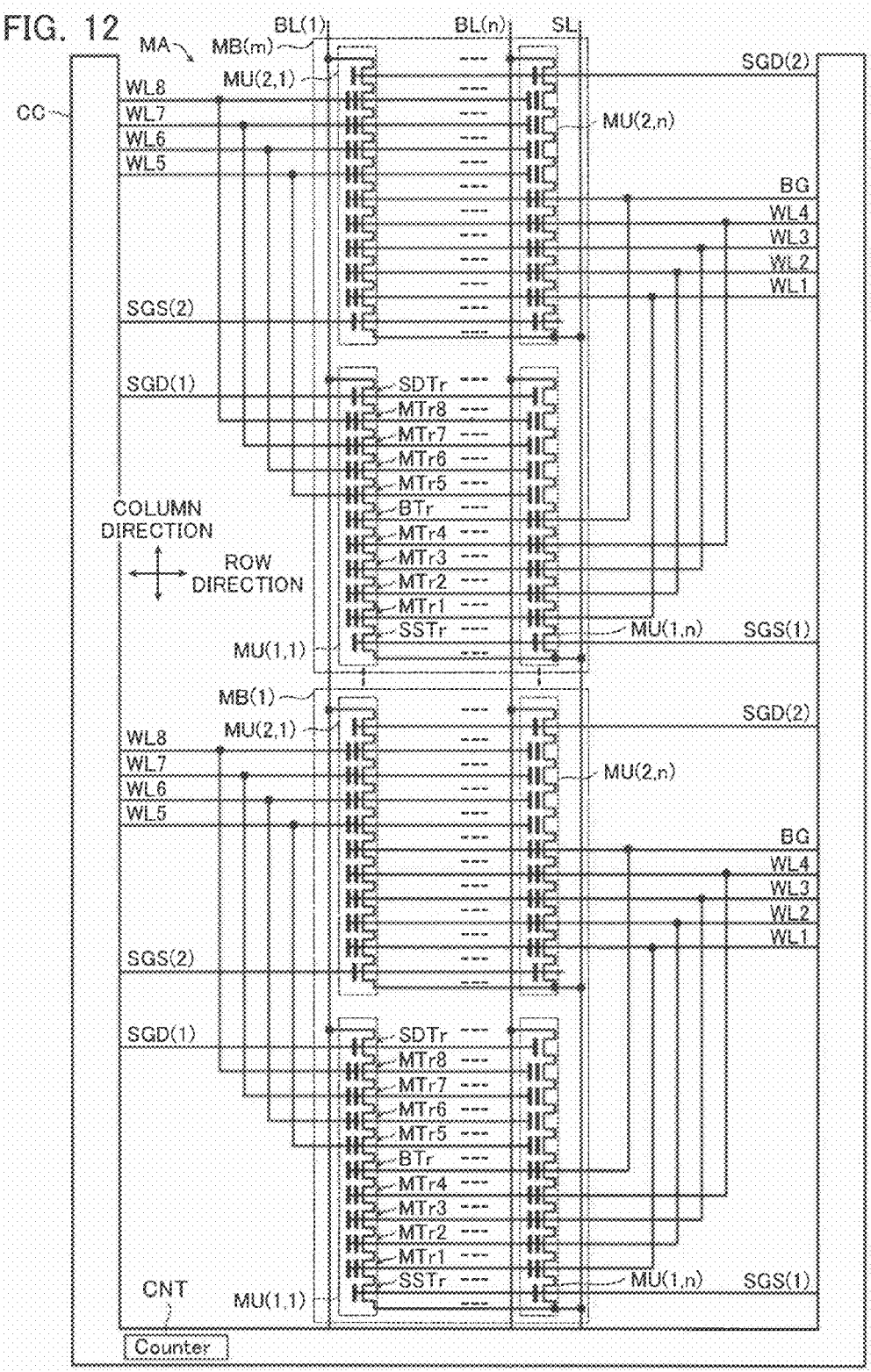
FIG. 12 illustrates a memory cell array MA and a peripheral circuit CC of a non-volatile semiconductor memory device according to a fourth embodiment.

A configuration of a non-volatile semiconductor memory device according to a fourth embodiment will now be described. With reference to FIG. 12, in the fourth embodiment, the control circuit CC includes a counter CNT. Only in this regard, the configuration of the fourth embodiment is different from the configuration of the first embodiment. The counter CNT counts the read number (the number of read operations performed) used in the refresh operation as described below.

[Refresh Operation]

Figure 13:
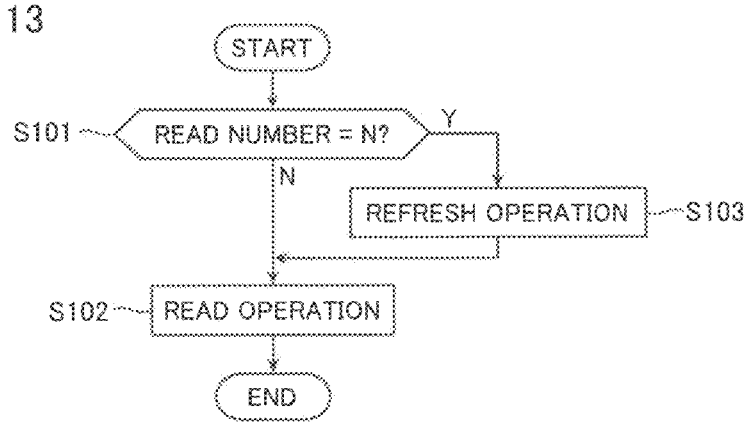
FIG. 13 is a flowchart showing a refresh operation according to the fourth embodiment.

Referring now to FIG. 13, the refresh operation according to the fourth embodiment will be described. With reference to FIG. 13, the control circuit CC determines whether the read number counted by the counter CNT reaches a predetermined number N (S101). Here, if the read number does not reach the predetermined number N in S101 (N in S101), the control circuit CC performs the read operation (S102).

In contrast, if the read number reaches the predetermined number N in S101 (Y in S101), the control circuit CC performs the refresh operation (S103) and then performs the read operation (S102). Note that if the control circuit CC performs the refresh operation, it resets the read number of the counter CNT.

As described above, according to the fourth embodiment, the control circuit CC performs the refresh operation only if the read number reaches the predetermined number N. Thus, compared to a process in which the refresh operation is performed every time before the read operation, the fourth embodiment may reduce the amount of time required for the refresh operation.

Fifth Embodiment

Figure 14:
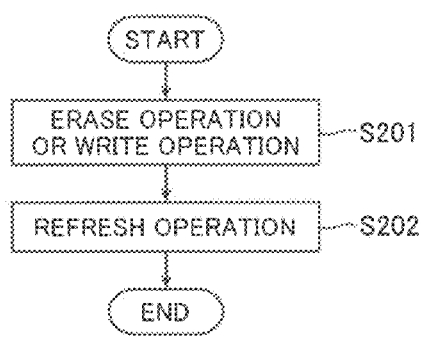
FIG. 14 is a flowchart showing a refresh operation according to a fifth embodiment.

A fifth embodiment will now be described. The non-volatile semiconductor memory device in the fifth embodiment has a similar configuration to that in the first embodiment. With reference to FIG. 14, in the fifth embodiment, every time the control circuit CC performs the erase operation or write operation (S201), it subsequently performs the refresh operation (S202). Thus, the fifth embodiment performs the refresh operation before the read operation.

Sixth Embodiment

A sixth embodiment will now be described. The non-volatile semiconductor memory device in the six embodiment has a generally similar configuration to that in the fourth embodiment. Note, however, that the counter CNT (see FIG. 12) counts the write or erase number (the number of the write operation or the erase operation) used in the refresh operation as described below. In this regard, the sixth embodiment is different from the fourth embodiment.

Figure 15:
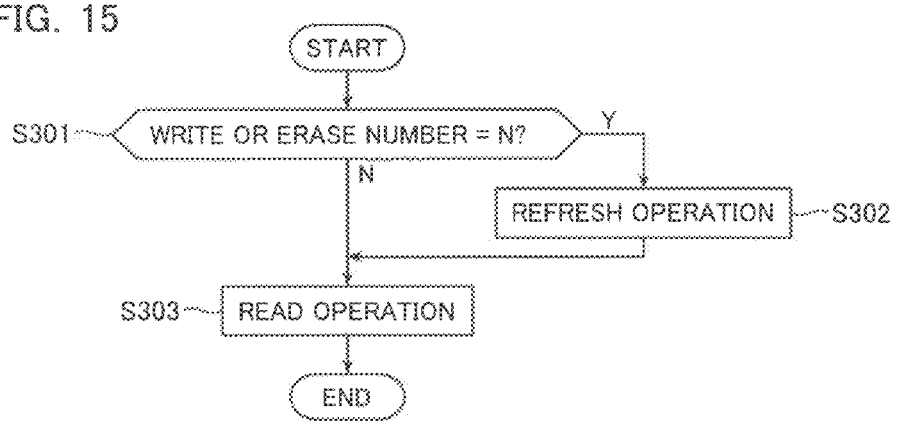
FIG. 15 is a flowchart showing a refresh operation according to a sixth embodiment.

With reference to FIG. 15, in the sixth embodiment, the control circuit CC determines whether the write or erase number counted by the counter CNT reaches a predetermined number N (S301). Here, if the write or erase number does not reach the predetermined number N in S301 (N in S301), the control circuit CC performs the read operation (S302).

In contrast, if the write or erase number reaches the predetermined number N in S301 (Y in S301), the control circuit CC performs the refresh operation (S303) and then performs the read operation (S302). Note that if the control circuit CC performs the refresh operation, it resets the write or erase number.

As described above, according to the sixth embodiment, the control circuit CC performs the refresh operation only if the write or erase number reaches the predetermined number N. Thus, compared to a process in which the refresh operation is performed every time the write or erase operations are performed, the sixth embodiment may reduce the amount of time required for the refresh operation.

Others

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

For example, the refresh operations according to the above embodiments may be performed before the verify operation (the write verify operation, the read verify operation).

Further, the refresh operation according to the first embodiment may be an operation that conducts a current from a first end to a second end of the memory string MS after the channels are formed in the memory transistors MTr1 to MTr8.

Further, the refresh operation according to the second embodiment may be an operation that renders conducive the source-side select transistor SSTr, the drain-side select transistor, SDTr, and the non-selected memory transistors MTr1, MTr2, and MTr4 to MTr8, and then renders the selected memory transistor MTr3 conductive.

Further, the fourth embodiment may perform the refresh operation between time t32 and t33 as shown in FIG. 11 more than once. Further, the number of memory transistors MTr1 to MTr8 is not limited to eight, and may be nine or more or seven or less.

For example, in the first embodiment, as shown in FIG. 16, at time t13 before the refresh operation, the voltage of the source-line SL may be increased. This causes the source-side select transistor SSTr to be kept in a non-conductive state in time t13 to t14, even if the source-side select transistor SSTr has a negative threshold voltage.

What is claimed is:

1. A non-volatile semiconductor memory device comprising:
   a semiconductor substrate;
   a memory string provided above the semiconductor substrate, and comprising a plurality of memory cells;
   a first select transistor having one end connected to a first end of the memory string;
   a second select transistor having one end connected to a second end of the memory string; and
   a control circuit configured to perform a read operation of reading data held in a selected memory cell among the memory cells;
   the memory string comprising:
   a semiconductor layer extending in a direction perpendicular to the semiconductor substrate, and functioning as a body of a memory cell;
   a charge accumulation layer configured to be capable of accumulating a charge; and
   a conductive layer sandwiching the charge accumulation layer with the semiconductor layer, and functioning as a gate of the memory cell,
   the control circuit performing, before the read operation, a refresh operation of rendering the selected memory cell and a non-selected memory cell conductive to conduct a current from the first end to the second end of the memory string,
   the control circuit rendering, during the refresh operation, the first select transistor, the selected memory cell, and the non-selected memory cell conductive, and then rendering the second select transistor conductive, and
   the control circuit performing the refresh operation when the number of a write operation of writing data to the memory cell and an erase operation of erasing data held in the memory cell reaches a first number.

2. A non-volatile semiconductor memory device comprising:
   a semiconductor substrate;
   a memory string provided above the semiconductor substrate, and comprising a plurality of memory cells; and
   a control circuit configured to perform a read operation of reading data held in a selected memory cell among the memory cells;
   the memory string comprising:
   a first semiconductor layer extending in a direction perpendicular to the semiconductor substrate, and functioning as a body of a memory cell;
   layer configured to be capable of accumulating a charge; and
   a first conductive layer sandwiching the charge accumulation layer with the first semiconductor layer, and functioning as a gate of the memory cell,
   the control circuit performing, before the read operation, a refresh operation of rendering the selected memory cell and a non-selected memory cell conductive to conduct a current from a first end to a second end of the memory string.

3. The non-volatile semiconductor memory device according to claim 2, further comprising:
   a first select transistor having one end connected to the first end of the memory string; and
   a second select transistor having one end connected to the second end of the memory string,
   the control circuit rendering, during the refresh operation, the first select transistor, the selected memory cell, and the non-selected memory cell conductive, and then rendering the second select transistor conductive.

4. The non-volatile semiconductor memory device according to claim 3, wherein
   the first select transistor comprises:
   a second semiconductor layer extending in a direction perpendicular to the semiconductor substrate, and functioning as a body of the first select transistor;
   a first gate insulating layer provided on a side surface of the second semiconductor layer; and
   a second conductive layer sandwiching the first gate insulating layer with the second semiconductor layer, and functioning as a gate of the first select transistor.

5. The non-volatile semiconductor memory device according to claim 4, wherein
the second select transistor comprises:
a third semiconductor layer extending in a direction perpendicular to the semiconductor substrate, and functioning as a body of the second select transistor;
a second gate insulating layer provided on a side surface of the third semiconductor layer; and
a third conductive layer sandwiching the second gate insulating layer with the third semiconductor layer, and functioning as a gate of the second select transistor.

6. The non-volatile semiconductor memory device according to claim 2, further comprising:
a first select transistor having one end connected to the first end of the memory string; and
a second select transistor having one end connected to the second end of the memory string,
the control circuit rendering, during the refresh operation, the first select transistor, the second select transistor, and the non-selected memory cell conductive, and then rendering the selected memory cell conductive.

7. The non-volatile semiconductor memory device according to claim 6, wherein
the control circuit applies a first voltage to a gate of the non-selected memory cell when rendering the non-selected memory cell conductive, and applies a second voltage to a gate of the selected memory cell when rendering the selected memory cell conductive, the second voltage being higher than the first voltage.

8. The non-volatile semiconductor memory device according to claim 2, wherein
the control circuit performs the refresh operation when the number of read operations performed reaches a first number.

9. The non-volatile semiconductor memory device according to claim 2, wherein
the control circuit performs the refresh operation after a write operation of writing data to the memory cell or an erase operation of erasing data held in the memory cell.

10. The non-volatile semiconductor memory device according to claim 2, wherein
the control circuit performs the refresh operation when the number of a write operation of writing data to the memory cell or an erase operation of erasing data held in the memory cell reaches a first number.

11. A method of reading data of a non-volatile semiconductor memory device, the non-volatile semiconductor memory device comprising:
a semiconductor substrate; and
a memory string provided above the semiconductor substrate, and comprising a plurality of memory cells,
the memory string comprising:
a first semiconductor layer extending in a direction perpendicular to the semiconductor substrate, and functioning as a body of a memory cell,
a charge accumulation layer configured to be capable of accumulating a charge; and
a first conductive layer sandwiching the charge accumulation layer with the first semiconductor layer, and functioning as a gate of the memory cell,
before a read operation of reading data held in a selected memory cell among the memory cells, a refresh operation is performed rendering the selected memory cell and a non-selected memory cell conductive to conduct a current from a first end to a second end of the memory string.

12. The method of reading data of a non-volatile semiconductor memory device according to claim 11, wherein
the non-volatile semiconductor memory device further comprises:
a first select transistor having one end connected to the first end of the memory string; and
a second select transistor having one end connected to the second end of the memory string,
during the refresh operation, the first select transistor, the selected memory cell, and the non-selected memory cell are rendered conductive, and then the second select transistor is rendered conductive.

13. The method of reading data of a non-volatile semiconductor memory device according to claim 11, wherein
the non-volatile semiconductor memory device comprises:
a first select transistor having one end connected to the first end of the memory string; and
a second select transistor having one end connected to the second end of the memory string,
during the refresh operation, the first select transistor, the second select transistor, and the non-selected memory cell are rendered conductive, and then the selected memory cell is rendered conductive.

14. The method of reading data of a non-volatile semiconductor memory device according to claim 13, wherein
a first voltage is applied to a gate of the non-selected memory cell when rendering the non-selected memory cell conductive, and a second voltage is applied to a gate of the selected memory cell when rendering the selected memory cell conductive, the second voltage being higher than the first voltage.

15. The method of reading data of a non-volatile semiconductor memory device according to claim 11, wherein
the refresh operation is performed when the number of read operations performed reaches a first number.

16. The method of reading data of a non-volatile semiconductor memory device according to claim 11, wherein
the refresh operation is performed after a write operation of writing data to the memory cell or an erase operation of erasing data held in the memory cell.

17. The method of reading data of a non-volatile semiconductor memory device according to claim 11, wherein
the refresh operation is performed when the number of a write operation of writing data to the memory cell or an erase operation of erasing data held in the memory cell reaches a first number.

* * * * *